United States Patent
Orellana

(10) Patent No.: US 9,490,803 B2
(45) Date of Patent: Nov. 8, 2016

(54) USER INTERFACE PANEL

(75) Inventor: Jay J. Orellana, Wheaton, IL (US)

(73) Assignee: TOUCHSENSOR TECHNOLOGIES, LLC, Wheaton, IL (US)

(*) Notice: Subject to any disclaimer, the term of this patent is extended or adjusted under 35 U.S.C. 154(b) by 696 days.

(21) Appl. No.: 12/952,457

(22) Filed: Nov. 23, 2010

(65) Prior Publication Data
US 2011/0122082 A1 May 26, 2011

Related U.S. Application Data

(60) Provisional application No. 61/263,505, filed on Nov. 23, 2009.

(51) Int. Cl.
H03K 17/96 (2006.01)

(52) U.S. Cl.
CPC ... *H03K 17/962* (2013.01); *H03K 2217/96077* (2013.01); *H03K 2217/960785* (2013.01)

(58) Field of Classification Search
CPC .................................................. H03K 17/962
USPC ................................................. 345/156–176
See application file for complete search history.

(56) References Cited

U.S. PATENT DOCUMENTS

| | | | |
|---|---|---|---|
| 4,090,092 A * | 5/1978 | Serrano | H03K 17/962 200/52 R |
| 4,302,647 A * | 11/1981 | Kandler | H01H 13/83 200/16 A |
| 4,380,040 A * | 4/1983 | Posset | H03K 17/962 200/600 |
| 5,239,152 A * | 8/1993 | Caldwell | H01H 13/702 200/5 R |
| 5,512,836 A * | 4/1996 | Chen | G01B 7/023 324/663 |
| 5,572,205 A * | 11/1996 | Caldwell | H03K 17/9622 200/600 |
| 5,593,222 A | 1/1997 | Maglica | |
| 5,594,222 A * | 1/1997 | Caldwell | 200/600 |
| 5,760,554 A * | 6/1998 | Bustamante | 318/280 |
| 5,760,715 A * | 6/1998 | Senk | H03K 17/9622 178/18.05 |
| 6,310,611 B1 | 10/2001 | Caldwell | |
| 6,320,282 B1 * | 11/2001 | Caldwell | H03K 17/962 200/600 |
| 6,958,459 B2 * | 10/2005 | Engelmann | G06F 3/044 200/310 |
| 7,255,466 B2 * | 8/2007 | Schmidt | G07C 9/0069 200/314 |
| 7,667,947 B2 * | 2/2010 | Schilling | H03K 17/975 361/277 |
| 7,705,257 B2 * | 4/2010 | Arione | H03K 17/962 200/314 |
| 8,383,989 B2 * | 2/2013 | Tominaga | H05B 6/062 219/220 |

(Continued)

FOREIGN PATENT DOCUMENTS

| | | | |
|---|---|---|---|
| DE | 10 2004 026836 | 12/2005 | |
| DE | 102004026836 | * 12/2005 | ........... H03K 17/962 |

OTHER PUBLICATIONS

Attached pdf file named "pasini_HP C8180_revuew.pdf" corresponding to the url: http://www.imaging-resource.com/PRINT/C8180/C8180.HTM, dated on Jun. 2008.*

(Continued)

*Primary Examiner* — Grant Sitta
(74) *Attorney, Agent, or Firm* — Barnes & Thornburg LLP

(57) ABSTRACT

A user interface panel includes a touch sensor having one or more sensing electrodes and a user interface substrate disposed on a circuit carrier substrate. The user interface substrate includes a touch surface comprising a conductive material. A gap separates a portion of the conductive material overlying one of the sensing electrodes from surrounding portions of the conductive material.

19 Claims, 5 Drawing Sheets

(56) References Cited

U.S. PATENT DOCUMENTS

| | | | |
|---|---|---|---|
| 9,088,283 B2* | 7/2015 | Wu | G06F 3/0202 |
| 2005/0001633 A1* | 1/2005 | Okushima et al. | 324/658 |
| 2005/0006213 A1* | 1/2005 | Engelmann | 200/310 |
| 2006/0192770 A1* | 8/2006 | Suzukawa | 345/173 |
| 2009/0032007 A1* | 2/2009 | Satou | H05B 6/062 |
| | | | 126/1 R |
| 2009/0261088 A1* | 10/2009 | Isoda | F24C 7/082 |
| | | | 219/489 |
| 2010/0103116 A1* | 4/2010 | Leung | G06F 1/1616 |
| | | | 345/173 |

OTHER PUBLICATIONS http://www.heilind.com/products/molex/news/molex_capacitive_switch.asp (dated Oct. 20, 2008, attached as molex_capacitive_swi.pdf.*

Int'l Search Report & Written Opinion issued in app. No. PCT/US2010/057734 (2011).

* cited by examiner

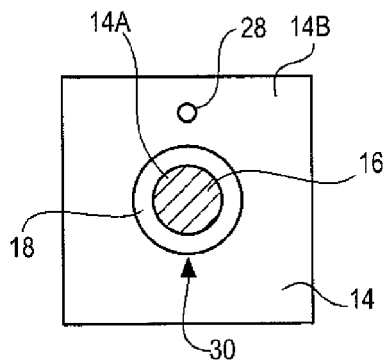
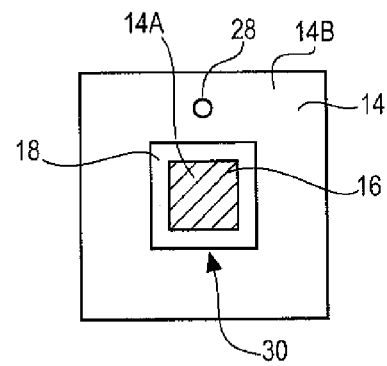
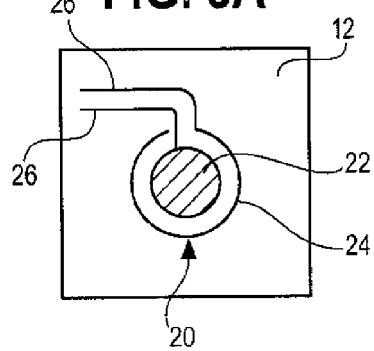
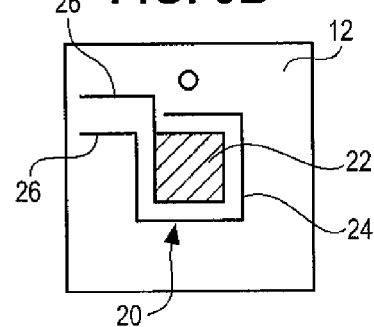
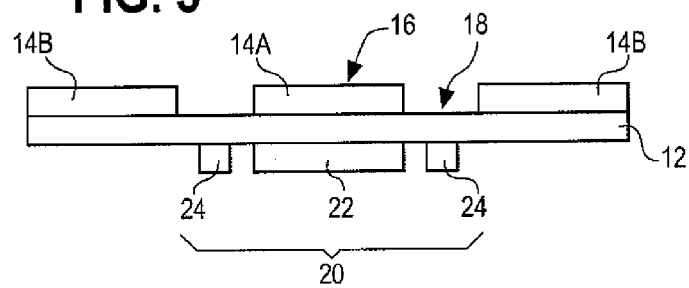
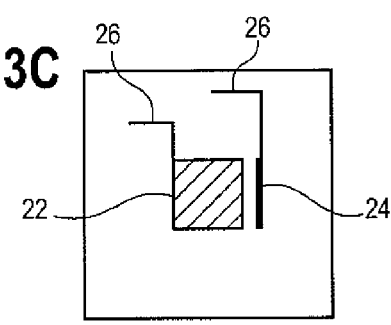

USER INTERFACE PANEL

CROSS-REFERENCE TO RELATED APPLICATIONS

This application claims priority from and incorporates the disclosure of U.S. Provisional Patent Application No. 61/263,505, filed on Nov. 23, 2009.

BACKGROUND OF THE INVENTION

The present invention is directed to a user interface panel using electronic sensor technology.

BRIEF DESCRIPTION OF THE DRAWINGS

FIG. 2A is a plan view of user interface substrate 14 defining a round touch surface 16, a gap 18 surrounding touch surface 16, and an indicator 28;

FIG. 2B is a plan view of user interface substrate 14 defining a square touch surface 16, a gap 18 surrounding touch surface 16, and an indicator 28;

FIG. 3A is a plan view of circuit carrier substrate 12 having a touch sensor 20 disposed thereon, touch sensor 20 including a generally round, conductive electrode pad 22 and a narrow, conductive electrode 24 substantially surrounding electrode pad 22;

FIG. 3B is a plan view of circuit carrier substrate 12 having a touch sensor 20 disposed thereon, touch sensor 20 including a generally square, conductive electrode pad 22 and a narrow, conductive electrode 24 substantially surrounding electrode pad 22;

FIG. 3C is a plan view of circuit carrier substrate 12 having a touch sensor 20 disposed thereon, touch sensor 20 including a generally square, conductive electrode pad 22 and a narrow, conductive electrode 24 abutting one side of electrode pad 22;

FIG. 5 is a cross-sectional view of user interface panel 10 including circuit carrier substrate 12 having touch sensor 20 disposed thereon and user interface substrate 14 defining touch surface 16 and gap 18 surrounding touch surface 16;

DETAILED DESCRIPTION OF THE ILLUSTRATED EMBODIMENTS

Figure 1:
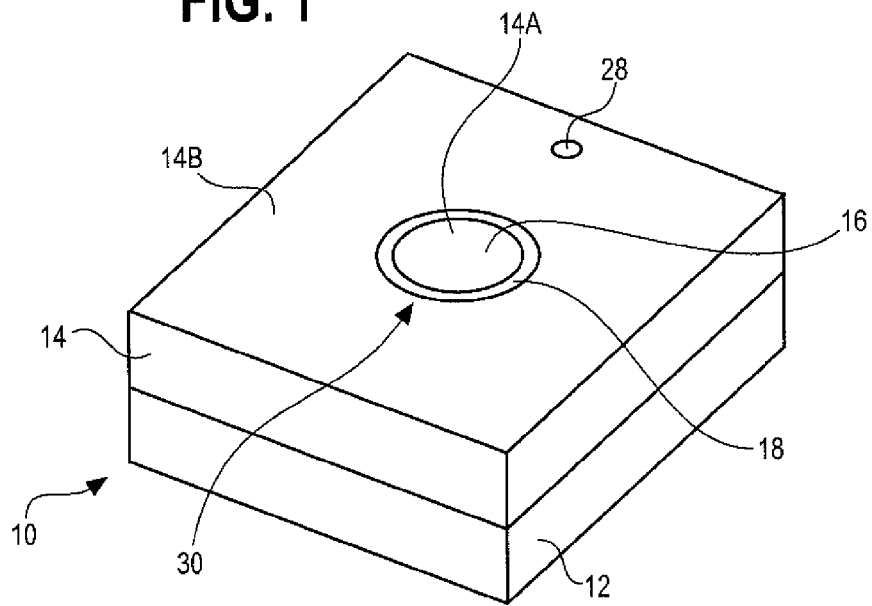
FIG. 1 is a perspective view of a user interface panel 10 including a circuit carrier substrate 12 and a user interface substrate 14 defining a touch surface 16, a gap 18 surrounding touch surface 16, and an indicator 28.

FIGS. 1-11 illustrate several exemplary embodiments of a user interface panel 10 including a circuit carrier substrate 12, a touch sensor 20 disposed on a first surface of circuit carrier substrate 12, and a user interface substrate 14 disposed on a second surface of circuit carrier substrate 12. User interface substrate 14 defines a touch surface 16 and a gap 18 surrounding touch surface 16.

Circuit carrier substrate 12 can be embodied as any rigid or flexible substrate suitable for carrying touch sensors, electrical circuitry, conductive traces, and/or electrical components. For example, circuit carrier substrate 12 can be embodied as a rigid printed wiring board made of FR4 material or a flexible carrier comprising a polyester or Mylar sheet. If embodied as a flexible carrier, circuit carrier substrate 12 preferably, but not necessarily, is attached to a further, rigid substrate. One skilled in the art would recognize that circuit carrier substrate 12 could be embodied in many other forms, as well. For example, circuit carrier substrate 12 could be embodied as a piece of glass, plastic, or other suitable material. Preferably, circuit carrier substrate 12 does not include, at least in the proximity of touch sensor 20 as described further below, any perforations, apertures or other means enabling liquids or other contaminants to pass through circuit carrier substrate 12, from one side thereof to the other.

Touch sensor 20 includes a first electrode 22 in the form of a conductive, inner electrode pad and a relatively narrow, second, outer electrode 24 adjacent at least a portion of first sensing electrode. Preferably, second sensing electrode 24 is spaced from and substantially surrounds first electrode 22, as shown in FIGS. 3A and 3B. In alternate embodiments, second sensing electrode 24 could be spaced from and adjacent only a portion of first sensing electrode 22, as shown in FIG. 3C.

Figure 8:
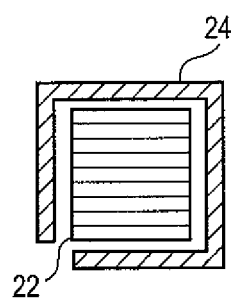
FIG. 8 is a plan view of an alternative structure for electrode pad 22.

FIGS. 3A and 3B illustrate first electrode 22 as having a solid geometric form. In other embodiments, first electrode 22 could have a substantially open, for example, annular or grid-like, geometric form and/or second electrode 24 could partially surround first electrode 22. FIG. 8 illustrates a first electrode 22 having a grid-like form and a second electrode 24 substantially surrounding first electrode 22. In alternate embodiments, second sensing electrode 24 could be spaced from and adjacent only a portion of first sensing electrode 22, rather than substantially surrounding first sensing electrode 22, as shown in FIG. 14.

Figure 4A:
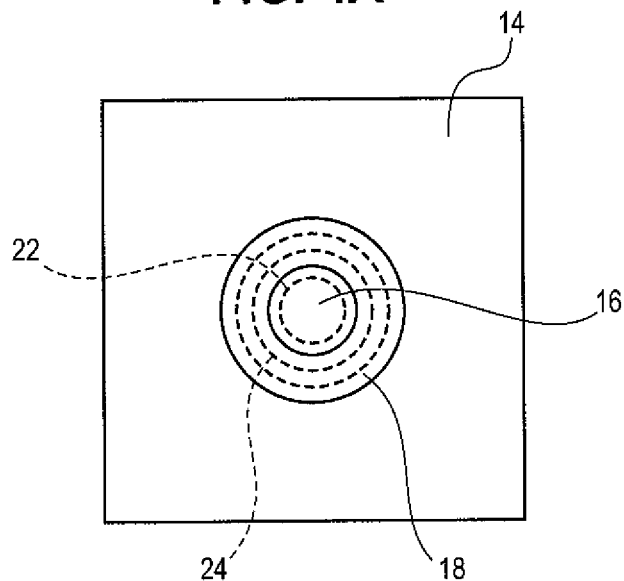
FIG. 4A is a plan view similar to FIG. 2A showing electrode pad 22 and electrode 24 in phantom.
Figure 4B:
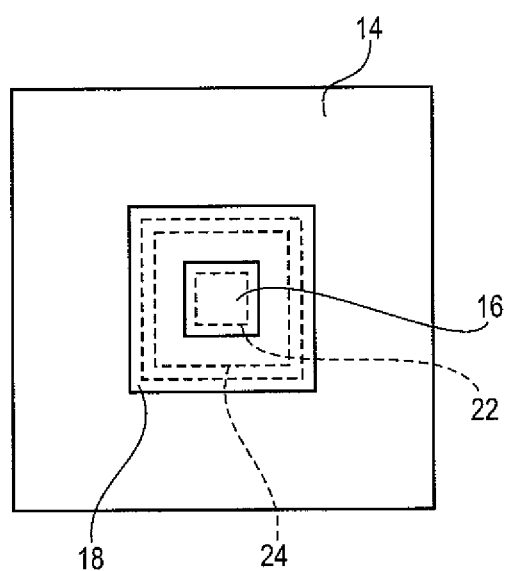
FIG. 4B is a plan view similar to FIG. 2B showing electrode pad 22 and electrode 24 in phantom.

FIGS. 3A and 4A illustrate first electrode 22 as generally round and second electrode 24 as generally annular. FIGS. 3B and 4B illustrate first electrode 22 as generally square and second electrode 24 as generally square annular. In other embodiments, first electrode 22 could have other shapes, for example, generally rectangular or irregular, and it could be of substantially open, rather than solid, form. In such embodiments, second electrode 24 could be formed to substantially or partially surround first electrode 22 and have a complementary or other shape.

First and second electrodes 22, 24 can be made of any suitable material and disposed on circuit carrier substrate 12 using any suitable technique, as would be recognized by one skilled in the art. Suitable materials include, without limitation, copper, silver, ITO, and other conductive and semi-conductive materials, as would be understood by one skilled in the art. Suitable techniques include, without limitation, plating/etching and screen printing, as would be understood by one skilled in the art.

Touch sensor 20 can include one or more active components, for example, transistors, disposed on circuit carrier substrate 12 proximate first and second electrodes 22, 24 and coupled thereto, as described in U.S. Pat. Nos. 5,594,222 and 6,310,611 assigned to TouchSensor Technologies, LLC, the disclosures of which are incorporated herein by reference. Alternatively, touch sensor 20 can include an integral field generation and detection circuit disposed on circuit carrier substrate 12 proximate first and second electrodes 22, 24 and coupled thereto, as described in U.S. Pat. No. 6,320,282 assigned to TouchSensor Technologies, LLC, the disclosure of which is incorporated herein by reference. The foregoing sensors sometimes are referred to as field effect sensors.

One or more electrical traces 26 can be disposed on circuit carrier substrate 12. Such traces can, for example, couple touch sensor 20 to one or more associated controlled devices, control circuits, or elements thereof, which can be located near to or relatively far from sensors 14. Such electrical traces can be disposed on circuit carrier substrate 12 using any suitable technique, as would be recognized by one skilled in the art.

User interface substrate 14 can be made of metal or other conductive material. For example, user interface substrate 14 can be embodied as a sheet of stainless steel, copper, aluminum, or other metal. Alternatively, user interface substrate 14 could be embodied as a plastic, glass or other substrate having a surface which is plated, coated, or otherwise partially or completely covered with a metal, for example, stainless steel, copper or aluminum, or other conductive material. Preferably, such surface is oriented outwardly so as to be visible to and/or touchable by a user. In either embodiment, the outward facing surface of user interface substrate 14 could bear a protective coating, for example, a lacquer coating. Such a coating could protect the surface from the environment, thereby inhibiting corrosion and simplify cleaning thereof. The coating could, but need not, act as an insulator. Preferably, the coating would be transparent so that the metal or conductive surface of user interface substrate 14 is visible there through.

User interface substrate 14 can be joined to circuit carrier substrate 12 using any suitable technique. For example, user interface substrate 14 can be joined to circuit carrier substrate 12 using adhesives, mechanical fasteners, and otherwise, as would be recognized by one skilled in the art. Preferably, user interface substrate 14 is joined to circuit carrier substrate 12 so as to minimize or eliminate any air gap between the two, at least in the proximity of first sensing electrode 22 and second sensing electrode 24 and the electric fields generated about them, as discussed further below.

User interface substrate 14 is shown in FIG. 5 as being disposed on a surface of circuit carrier substrate 12 opposite the surface on which touch sensors 20 and other circuitry and circuit components are located. In other embodiments, user interface substrate 14 can be disposed on the same side of circuit carrier substrate 12 as touch sensors 20 and/or other conductive circuitry and/or circuit components, provided that some form of electrical insulation is provided between conductive portions of user interface substrate 14 and such electrical components. Such insulation could be embodied as a discrete insulating layer or a portion of user interface substrate 14 having suitable qualities as an electrical insulator. For example, user interface substrate 14 could be embodied as a plastic substrate with a metalized user interface surface, with the plastic portion acting as an insulator between the metalized surface and such electrical components.

User interface substrate 14 (or, in embodiments wherein user interface substrate 14 is a non-conductive substrate with a metal or other conductive coating or overlay, the conductive surface thereof) includes a center portion 14A and a surrounding portion 14B that together define gap 18 between center portion 14A and surrounding portion 14B. In essence, surrounding portion 14B defines an aperture 30 in user interface substrate 14 or the conductive portion thereof, part of which is occupied by center portion 14A. Aperture 30 and center portion 14A are illustrated as being circular, but can take other shapes as well. For example, aperture 30 and center portion 14A can have generally rectangular, round, or other regular or irregular shapes. Aperture 30 and center portion 14A can, but need not, have complementary shapes. Consequently, gap 18 could, but need not, have a uniform width. The exposed surface of center portion 14A defines touch surface 16.

Figure 9:
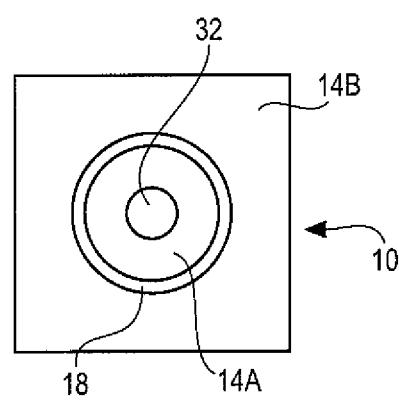
FIG. 9 is a plan view of a portion of user interface substrate 14 defining touch surface 16.
Figure 10:
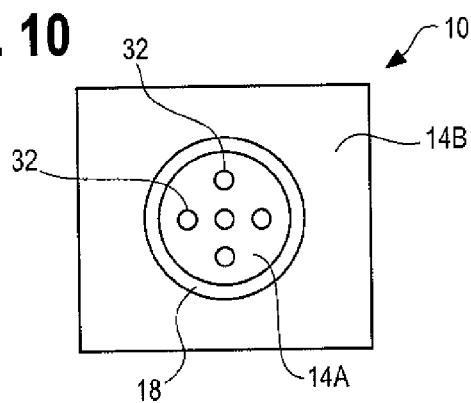
FIG. 10 is a plan view of a portion of user interface substrate 14 defining touch surface 16.
Figure 11:
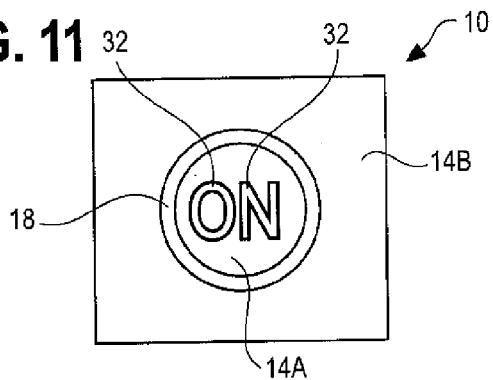
FIG. 11 is a plan view of a portion of user interface substrate 14 defining touch surface 16.

FIGS. 1, 2A, 2B, 4A, 4B, 6 and 7 illustrate center portion 14A as having a generally solid geometric form. In other embodiments, center portion 14A could have a more open geometric form. For example, as shown in FIGS. 9-11, center portion 14A could include one or more apertures or perforations 32 therein. Apertures 32 could have any desired shape, and could be provided for decorative and/or functional purposes. For example, as shown in FIG. 11, apertures 32 could form text representing the function controlled by the corresponding touch sensor. Apertures 32 could form other text, as well. Backlighting could be provided to illuminate apertures 32 independently from gap 18 to further identify the location of the corresponding touch sensor, to indicate the status of a corresponding controlled device, or otherwise. For example, in the FIG. 11 embodiment, apertures 32 could be backlit at a first intensity or in a first color to identify the location of the corresponding touch sensor and be backlit at a second intensity or in a second color to indicate that the corresponding controlled device is in the "ON" state.

Center portion 14A overlies at least a portion of first electrode 22 of touch sensor 20. In the embodiments illustrated in FIGS. 4A and 4B (which are not drawn to scale), center portion 14A completely overlies first electrode 22. In the embodiment illustrated in FIG. 6, center portion 14A overlies most of first electrode 22. In other embodiments, center portion 14a could overlie half or less of first electrode 22.

In the foregoing embodiments, center portion 14A does not overlie second electrode 24 or the area between first electrode 22 and second electrode 24. In other embodiments, center portion 14A could overlie a relatively small portion of second electrode 24 and the area between first electrode 22 and second electrode 24. In further embodiments, center portion 14A could overlie a larger portion, or substantially all, of second electrode 24.

In the embodiments illustrated in FIGS. 4A and 4B, surrounding portion 14B surrounds second electrode 24 such that no portion of surrounding portion 14B overlies second electrode 24. In some embodiments, for example, the embodiment illustrated in FIG. 6, surrounding portion 14B can overlie a relatively small portion of second electrode 24. In other embodiments, surrounding portion 14B could overlie more or substantially all of second electrode 24. Preferably, surrounding portion 14B would not overlie any portion of first electrode 22.

Figure 6:
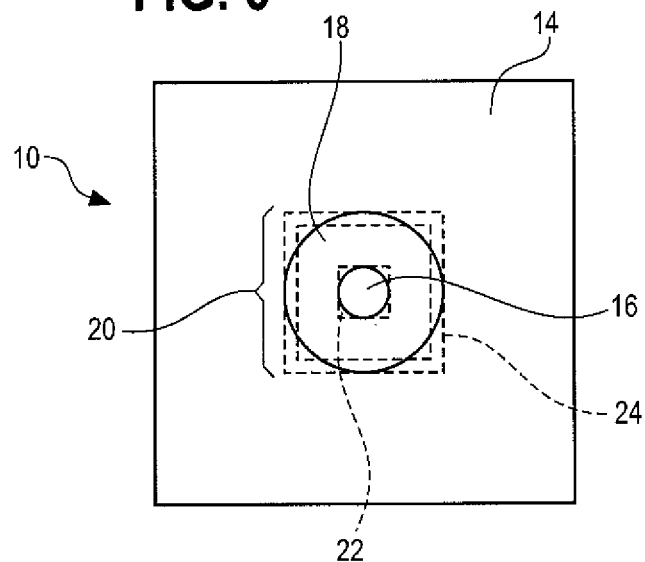
FIG. 6 is a plan view of an interface panel 10 having a generally round touch surface 16, a generally annular gap 18, and a touch sensor 20, shown in phantom, having a generally square electrode 22 pad and a generally square annular electrode 24 substantially surrounding electrode pad 22.

Aperture 30, center portion 14B, and gap 18 can, but need not, have shapes complementary to those of touch sensor 20, first electrode 22, and second electrode 24, respectively. For example, FIGS. 2A, 3A and 4A illustrate embodiments wherein first electrode 22 and second electrode 24 have generally round and annular shapes, respectively, which are complementary to the generally round and annular shapes of center portion 14A and gap 18, respectively. Also, FIGS. 2B, 3B and 4B illustrate embodiments wherein first electrode 22 and second electrode 24 have generally square and square annular shapes, respectively, which are complementary to the generally square and square annular shapes of center portion 14A and gap 18. FIG. 6, on the other hand, illustrates an embodiment wherein first electrode 22 and second electrode 24 have generally square and square annular shapes, respectively, which are not complementary to the generally round and annular shapes of center portion 14A and gap 18.

As suggested above, gap 18 can, but need not, completely overlie second electrode 24 such that the entirety of second electrode 24 would be visible through gap 18 but for any intervening structure, for example, circuit carrier substrate 12 on which second electrode 24 is disposed. For example, in the embodiments illustrated in FIGS. 2A, 3A and 4A, and in FIGS. 2B, 3B and 4B, gap 18 completely overlies second electrode 24. On the other hand, in the embodiment shown in FIG. 6, gap 18 does not completely overlie second electrode 24. In further embodiments, other portions or even the entirety of second electrode 24 could be obscured by center portion 14A or surrounding portion 14B of user interface substrate 14 (or the metal or otherwise conductive surface thereof). For example, center portion 14A or surrounding portion 14B could overlie the entirety of second electrode 24.

In the illustrated embodiments, gap 18 completely overlies second electrode 24 where center portion 14A, gap 18, first electrode 22 and second electrode 24 have complementary shapes, and gap 18 does not completely overlie second electrode 24 where gap 18, first electrode 22 and second electrode 24 do not have complementary shapes. In other embodiments wherein gap 18, first electrode 22 and second electrode 24 have complementary shapes, gap 18 could only partially overlie second electrode 24. In further embodiments where two or more of gap 18, first electrode 22 and second electrode do not have complementary shapes, gap 18 could completely overlie second electrode 24. In still other embodiments, gap 18 could overlie no portion of second electrode 24.

User interface 10 can, but need not, include an indicator to indicate, for example, the status of touch sensor 20 or the status of a controlled device coupled to touch sensor 20. Such an indicator can be embodied as an aperture 28 in user interface substrate 14 and any suitable means for backlighting aperture 28, for example a lamp, LED, or other suitable light source, with or without a suitable reflector, as would be recognized by one skilled in the art.

User interface 10 can, but need not, include means for illuminating gap 18. For example, a lamp, LED, or other suitable light source, with or without a suitable reflector, can be used to backlight gap 18, as would be recognized by one skilled in the art. Such lighting structures and/or associated power and control circuitry could be located on a side of circuit carrier substrate 12 away from user interface substrate 14. Alternatively, such lighting structures and/or associated power and control circuitry could be located on a separate substrate attached to or otherwise associated with a side of circuit carrier substrate 12 away from user interface substrate 14. In such embodiments, at least relevant portions of circuit carrier substrate 12 would need to be sufficiently transparent or translucent to allow light to pass toward gap 18.

In other embodiments, front-lighting could be provided using light pipe structure located between circuit carrier substrate 12 and the user interface substrate 14 and one or more associated light sources, for example, lamps or LEDs. In embodiments wherein user interface substrate 14 is a plastic, glass, or other substrate plated, coated or otherwise covered with a metal or other conductive material, the substrate material itself could be used to conduct light provided by a light source. For example, an LED could protrude into user interface substrate 14 from circuit carrier substrate 12 or elsewhere, thereby providing light to illuminate transparent or translucent portions of user interface substrate 14.

Figure 7:
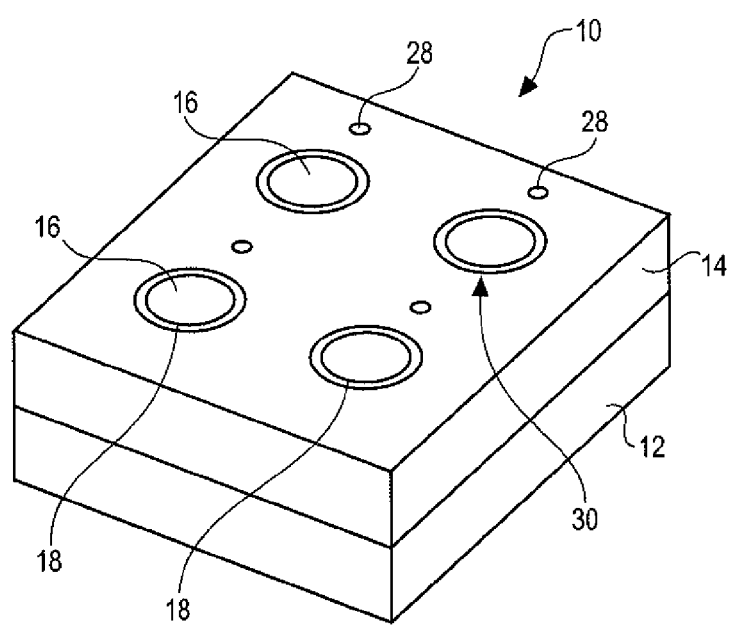
FIG. 7 is a perspective view of a user interface panel 10 including a circuit carrier substrate 12 and a user interface substrate 14 that defines a plurality of touch surfaces 16 and gaps 18 surrounding touch surfaces 16.

FIGS. 1-6 illustrate user interface panels 10 having a single touch sensor 20 and touch surface 16. In other embodiments, a user interface panel 10 can include more than one touch sensor 20 and touch surface 16. FIG. 7 illustrates a user interface panel 10 having four touch sensors 20 and touch surfaces 16. In other embodiments, a user interface panel 10 could have more or fewer than four touch sensors 20 and touch surfaces 16.

In operation, a field generation circuit associated with touch sensor 20 generates electric fields about first and second electrodes 22, 24. At least a portion of the electric field generated about first electrode 22 couples with center portion 14A. At least a portion of the electric field generated about second electrode 24 penetrates user interface substrate 14 through gap 18. The electric field generated about second electrode 24 tends to preclude the electric field generated about first electrode 22 from coupling to surrounding portion 14B.

A detection circuit associated with touch sensor 20 can detect disturbances to the foregoing electric fields resulting from the proximity of a stimulus, for example, a finger or other conductive object, to touch surface 16 and/or gap 18, and can distinguish whether such stimulus is proximate touch surface 16, gap 18, or both, based on disturbances to the electric fields caused by such stimulus. The detection circuit can be configured to output a signal (or lack thereof) indicative of a touch to touch surface 16 when a stimulus is proximate only touch surface 16. The field detection circuit also can be configured to output a signal (or lack thereof) indicative of no touch to touch surface 16 when no stimulus is present proximate touch surface 16, when a stimulus is simultaneously present proximate touch surface 16 and gap 18 or when a stimulus is present proximate gap 18 but not touch surface 16.

In alternative embodiments, second electrode 24 could be omitted. In such embodiments, first electrode 22 preferably, but not necessarily, is fully contained underneath center portion 14A such that gap 18 precludes or limits coupling of the electric field generated about first electrode 22 to surrounding portion 14B. In such embodiments, touch sensor 20 could be configured to output a signal (or lack thereof) indicative of a touch to touch surface 16 when a stimulus is present proximate touch surface 16, regardless of whether the stimulus also is present proximate gap 18, and to output a signal (or lack thereof) indicative of no touch to touch surface 16 when a stimulus is not present proximate touch surface 16.

Figure 13:
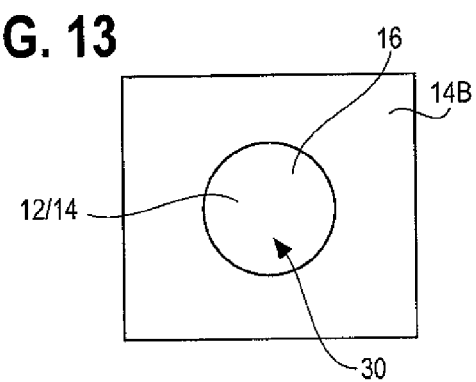
FIG. 13 is a plan view of a user interface panel 10 having another alternate form of user interface substrate 14.

In other alternative embodiments, center portion 14A could be omitted. In such embodiments, touch surface 16 is defined by the structure underlying omitted center portion 14A, as shown in FIG. 13. This structure could be, for example, an exposed surface of circuit carrier substrate 12 or, where user interface substrate 14 is embodied as a non-conductive substrate bearing a conductive coating, a portion of the non-conductive substrate 14.

In such embodiments, both first electrode 22 and second electrode 24 preferably lie within the confines of aperture 30 such that the electric fields generated about first electrode 22 and second electrode 24, or portions thereof, penetrate user interface substrate 14 through aperture 30. The detection circuit detects disturbances to the electric fields caused by a stimulus in proximity thereto. The detection circuit could be configured to output a signal (or lack thereof) indicative of a touch to touch surface 16 when a stimulus is proximate only the portion of touch surface 16 overlying first electrode 22. The field detection circuit also can be configured to output a signal (or lack thereof) indicative of no touch to touch surface 16 when no stimulus is present proximate touch surface 16, when a stimulus is simultaneously present proximate the portion of touch surface 16 overlying first electrode 22 and second electrode 24, or when a stimulus is present proximate the portion of touch surface 16 overlying second electrode 24 but not the portion of touch surface 16 overlying first electrode 22.

Alternatively, surrounding portion 14B could overlie some portion or all of second electrode 24, or it could overlie all of second electrode 24 and a portion of first electrode 22. In such embodiments, at least a portion of the electric field generated about first electrode 22 would penetrate user interface surface 14 through aperture 30 and at least a portion of the electric field generated about second electrode 24 could couple to surrounding portion 14B. In such embodiments, the detection circuit could be configured to output a signal (or lack thereof) indicative of a touch to touch surface 16 when a stimulus is proximate only touch surface 16 and to output a signal (or lack thereof) indicative of no touch to touch surface 16 when no stimulus is present proximate touch surface 16, when a stimulus is simultaneously present proximate touch surface 16 and neighboring portions of surrounding portion 14B, or when a stimulus is present proximate neighboring portions of surrounding portion 14B but not proximate touch surface 16.

Figure 12:
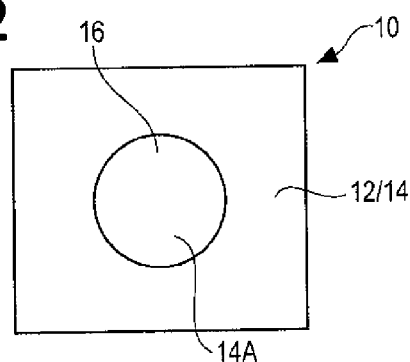
FIG. 12 is a plan view of a user interface panel 10 having an alternate form of user interface substrate 14.

In further embodiments, surrounding portion 14B could be omitted. In such embodiments, center portion 14A overlies some or all of first electrode 22 and could further overlie all or some of second electrode 24. One such embodiment is shown in FIG. 12. The principles of operation for such embodiments are similar to those described above in connection with embodiments including both center portion 14A and surrounding portion 14B, except that portions of the electric field generated about outer electrode 24 simply extend around and past the periphery of center portion 14A, rather than penetrating user interface substrate 14 through gap 18 (which gap would not exist in such embodiments due to the omission of surrounding portion 14B).

The foregoing descriptions and drawings set forth certain exemplary embodiments of the invention, but are not intended to limit the scope thereof. One skilled in the art would recognize that the exemplary embodiments could be modified without departing from the scope of the invention as claimed below.

I claim:

1. A user interface comprising:
    a circuit carrier substrate;
    a first electrode structure disposed on said circuit carrier substrate, said first electrode structure comprising a first sensing electrode and a second sensing electrode adjacent at least a portion of said first sensing electrode, said second sensing electrode substantially surrounding said first sensing electrode;
    a second electrode structure disposed on said circuit carrier, said second electrode structure comprising a first sensing electrode and a second sensing electrode adjacent at least a portion of said first sensing electrode;
    a field generation and detection circuit coupled to said first sensing electrode and said second sensing electrode of said first electrode structure and to said first sensing electrode and said second sensing electrode of said second electrode structure;
    a user interface substrate associated with said circuit carrier substrate, said user interface substrate comprising a layer of conductive material defining a first gap and second gap, said first gap surrounding a first center portion of said layer of conductive material, said first center portion overlying at least a portion of said first sensing electrode and at least a portion of said second sensing electrode of said first electrode structure, said second gap surrounding a second center portion of said layer of conductive material, and said first gap and said second gap being surrounded by a surrounding portion of said layer of conductive material; and
    an electrical insulator separating said first and second electrode structures from said layer of conductive material, said surrounding portion of said layer of conductive material being on the same side of said electrical insulator as said first center portion of said layer of conductive material and said second center portion of said layer of conductive material.

2. The user interface of claim 1 wherein said first sensing electrode of said first electrode structure comprises a thin conductive electrode pad having a substantially closed geometric form.

3. The user interface of claim 1 wherein said first sensing electrode of said first electrode structure comprises a thin conductive electrode pad having a substantially open geometric form.

4. The user interface of claim 1 wherein said first gap substantially overlies said second sensing electrode of said first electrode structure.

5. The user interface of claim 1 wherein said surrounding portion overlies at least a portion of said second sensing electrode of said first electrode structure.

6. The user interface of claims 1 wherein said field generation and detection circuit is embodied on an integrated circuit proximate said first and second sensing electrodes of said first electrode structure.

7. The user interface of claim 1 wherein said field generation and detection circuit generates electric fields about said first and second sensing electrodes of said first electrode structure.

8. The user interface of claim 7 wherein at least a portion of said electric field about said second sensing electrode of said first electrode structure penetrates said user interface substrate through said gap.

9. The user interface of claim 8 wherein said field generation and detection circuit detects disturbances to said electric fields and provides an output indicative of proximity of a stimulus to said center portion.

10. The user interface of claim 1 further comprising an indicator.

11. The user interface of claim 10 wherein said indicator comprises an aperture in said user interface substrate and a light source associated with said aperture.

12. The user interface of claim 1 further comprising means for illuminating said first gap.

13. The user interface of claim 1 wherein said user interface substrate comprises a conductive material.

14. The user interface of claim 13 wherein said user interface substrate comprises stainless steel, aluminum, or copper.

15. The user interface of claim 1 wherein said user interface substrate comprises a dielectric material having a conductive surface disposed thereon.

16. The user interface of claim 1 wherein substantially no air gap exists between said circuit carrier substrate and said user interface substrate proximate said first electrode structure.

17. The user interface of claim 1 wherein substantially no air gap exists between said circuit carrier substrate and said user interface substrate.

18. The user interface of claim 1 wherein said first electrode structure and said user interface substrate are located on different sides of said circuit carrier substrate.

19. The user interface of claim 1 wherein at least a portion of said first electrode structure and said user interface substrate are located on the same side of said circuit carrier substrate.

* * * * *